(12) United States Patent
Wassink

(10) Patent No.: US 7,453,071 B2
(45) Date of Patent: Nov. 18, 2008

(54) CONTAMINATION BARRIER AND LITHOGRAPHIC APPARATUS COMPRISING SAME

(75) Inventor: Arnoud Cornelis Wassink, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 269 days.

(21) Appl. No.: 11/391,691

(22) Filed: Mar. 29, 2006

(65) Prior Publication Data

US 2006/0219958 A1  Oct. 5, 2006

(51) Int. Cl.
*G03F 7/20* (2006.01)
(52) U.S. Cl. .............. 250/492.2; 250/504 R; 378/34; 378/119; 355/30
(58) Field of Classification Search .............. None
See application file for complete search history.

(56) References Cited

U.S. PATENT DOCUMENTS

| | | | | |
|---|---|---|---|---|
| 4,408,338 | A | 10/1983 | Grobman | 378/34 |
| 4,837,794 | A | 6/1989 | Riordan et al. | 378/119 |
| 6,359,969 | B1 | 3/2002 | Shmaenok | 378/156 |
| 6,459,472 | B1 | 10/2002 | De Jager et al. | 355/68 |
| 6,838,684 | B2 | 1/2005 | Bakker et al. | 250/492.2 |
| 7,034,308 | B2 | 4/2006 | Bakker et al. | 250/370.08 |
| 7,057,190 | B2 | 6/2006 | Bakker et al. | 250/492.2 |
| 7,106,832 | B2 | 9/2006 | Klunder et al. | 378/156 |
| 7,145,132 | B2 | 12/2006 | Bakker et al. | 250/251 |
| 2004/0184014 | A1 | 9/2004 | Bakker et al. | 355/30 |
| 2006/0012761 | A1 | 1/2006 | Bakker et al. | 355/30 |
| 2006/0138348 | A1 | 6/2006 | Bakker | 250/492.1 |
| 2006/0138362 | A1 | 6/2006 | Bakker et al. | 250/504 |
| 2006/0139604 | A1 | 6/2006 | Wassink et al. | 355/67 |
| 2006/0151717 | A1 | 7/2006 | Klunder et al. | 250/492.2 |
| 2006/0169929 | A1 | 8/2006 | Wassink | 250/504 |
| 2006/0186353 | A1 | 8/2006 | Wassink | 250/492.2 |
| 2006/0261290 | A1 | 11/2006 | Van Herpen et al. | 250/492.2 |
| 2007/0018118 | A1 | 1/2007 | Sjmaenok et al. | 250/492.2 |
| 2007/0023706 | A1 | 2/2007 | Sjmaenok et al. | 250/504 |

FOREIGN PATENT DOCUMENTS

| | | |
|---|---|---|
| DE | 102 37 901 B3 | 5/2004 |
| EP | 1 274 287 A1 | 1/2003 |
| EP | 1 434 098 A2 | 6/2004 |
| EP | 1 491 963 A2 | 12/2004 |
| EP | 1 491 963 A3 | 8/2005 |
| JP | 9-320792 | 12/1997 |
| JP | 2000-98098 | 4/2000 |
| JP | 2001-57298 | 2/2001 |

(Continued)

OTHER PUBLICATIONS

Levinus Pieter Bakker, U.S. Appl. No. 11/493,848, filed Jul. 27, 2006.

(Continued)

*Primary Examiner*—Jack I Berman
(74) *Attorney, Agent, or Firm*—Pillsbury Winthrop Shaw Pittman, LLP

(57) ABSTRACT

A rotatable contamination barrier is disclosed that has a plurality of closely packed blades configured to trap contaminant material coming from a radiation source. The blades are radially oriented relative to a central rotation axis of the contamination barrier. The blades comprise a metal compound having crystals oriented generally radially relative to the central rotation axis.

26 Claims, 6 Drawing Sheets

FOREIGN PATENT DOCUMENTS

| | | |
|---|---|---|
| WO | WO 99/42904 | 8/1999 |
| WO | WO 01/37309 A1 | 5/2001 |

OTHER PUBLICATIONS

Leonid Aizikovitch Sjmaenok, U.S. Appl. No. 11/481,252, filed Jul. 6, 2006.

Arnoud Cornelis Wasink, U.S. Appl. No. 11/433,761, filed May 15, 2006.

Lambertus Adrianus Van Den Wildenberg, U.S. Appl. No. 11/392,951, filed Mar. 30, 2006.

Derk Jan Wilfred Klunder, U.S. Appl. No. 11/319,190, filed Dec. 28, 2005.

Derk Jan Wilfred Klunder, U.S. Appl. No. 11/294,347, filed Dec. 6, 2005.

Leonid Aizikovitch Sjmaenok, U.S. Appl. No. 11/175,036, filed Jul. 6, 2005.

Maarten Marinus Johannes Wilhelmus Van Herpen, U.S. Appl. No. 11/133,460, filed May 20, 2005.

CONTAMINATION BARRIER AND LITHOGRAPHIC APPARATUS COMPRISING SAME

FIELD

The present invention relates to a contamination barrier and a lithographic apparatus comprising the same.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive metal compound (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Radiation sources used in EUV lithography typically generate contaminant material that is harmful to the optics and the working environment wherein the lithographic process is carried out. Such is especially the case for EUV sources operating via a laser induced plasma or discharge plasma. Hence, in EUV lithography, a desire exists to limit the contamination of the optical system arranged to condition the beam of radiation coming from an EUV source. To this end, a foil trap, for instance, as disclosed in European patent application publication EP1491963, has been proposed. A foil trap uses a high number of closely packed foils or blades. Contaminant debris, such as micro-particles, nano-particles and ions can be trapped in the walls provided by the blades. Thus, the foil trap functions as a contamination barrier trapping contaminant material from the source.

SUMMARY

In an embodiment, a rotatable foil trap may be oriented with a rotation axis along an optical axis of the system, in particular in front of an extreme ultraviolet radiation source configured to provide extreme ultraviolet radiation. The blades configured to trap contaminant material thus may be radially oriented relative to a central rotation axis of the contamination barrier and may be aligned substantially parallel to the direction of radiation. By rotating the foil trap at a sufficiently high speed, traveling contaminant debris may be captured by the blades of the contamination barrier. Due to design limitations, the rotation speed of the contaminant barrier may be quite high, since otherwise the length of the blades along the direction of travel of the debris would be unacceptably large. Typical revolution speeds are 15000-30000 RPM, speeds which may cause considerable stress in the metal compound of the contaminant barrier, in particular, in the operative temperature of the radiation source, where the contaminant barrier may heat up to temperatures well above 600° C. Furthermore, potential breakdown of the contaminant barrier may be harmful for the machine, and may cause considerable costly down time. In an embodiment, a radiation system configured to provide a projection beam of radiation comprises a rotatable contamination barrier comprising a plurality of closely packed blades configured to trap contaminant material coming from a radiation source.

It is desirable, for example, to provide a contamination barrier that is more robust and which has an increased strength, in particular, the blades thereof.

According to an aspect of the invention, there is provided a rotatable contamination barrier for use in an EUV system, the barrier comprising a plurality of closely packed blades configured to trap contaminant material coming from an EUV radiation source, the blades radially oriented relative to a central rotation axis of the contamination barrier, wherein the blades comprise a metal compound having a uniform crystal orientation oriented generally radially relative to the central rotation axis.

According to an aspect of the invention, there is provided a method of providing a rotatable contamination barrier, the method comprising:

axially compressing a rod of metal compound material having orientable crystals by forging so that the rod starts to expand in an expansion zone and the crystals radially align in the expansion zone; and cutting a blade structure in the expansion zone around a central zone, so as to provide the contamination barrier.

According to an aspect of the invention, there is provided a method of providing a rotatable contamination barrier, the method comprising:

providing a folded blade shape from a rolled sheet of metal compound material having a uniform crystal orientation oriented along a rolling direction, the fold oriented transverse to the rolling direction;

engaging the folds by mounting elements to hold the folds parallel to a central rotation axis of the contamination barrier; and orienting the blades radially relative to the rotation axis, so as to provide the contamination barrier.

According to an aspect of the invention, there is provided a lithographic apparatus, comprising:

a rotatable contamination barrier comprising a plurality of closely packed blades configured to trap contaminant material coming from a radiation source, the blades radially oriented relative to a central rotation axis of the contamination barrier, wherein the blades comprise a metal compound material having a uniform crystal orientation oriented generally radially relative to the central rotation axis;

an illumination system configured to condition a beam of radiation;

a support constructed to support a patterning device, the patterning device being capable of imparting the radiation beam with a pattern in its cross-section to form a patterned radiation beam;

a substrate table constructed to hold a substrate; and a projection system configured to project the patterned radiation beam onto a target portion of the substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
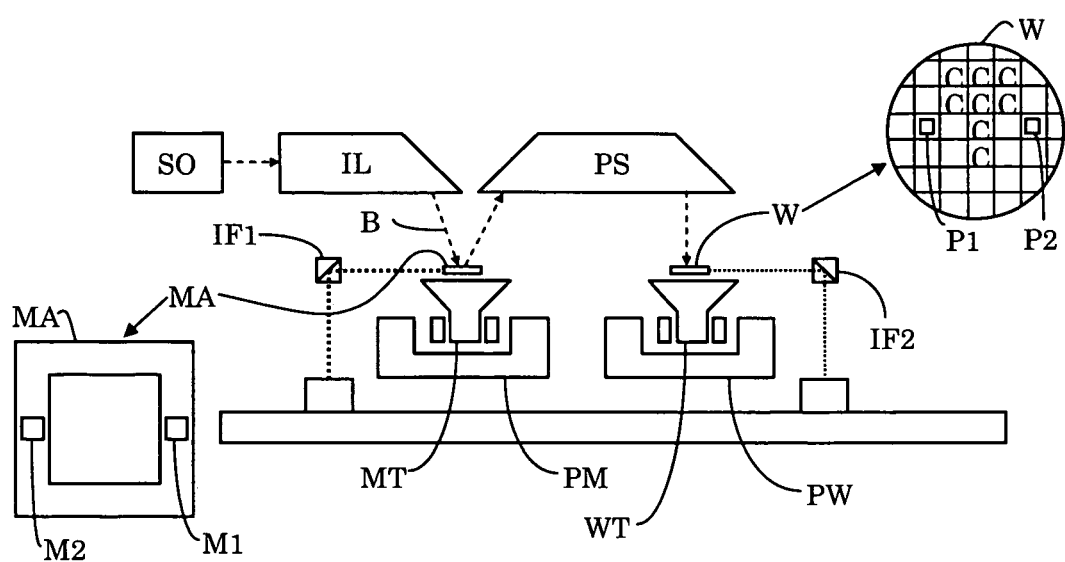
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV radiation);

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
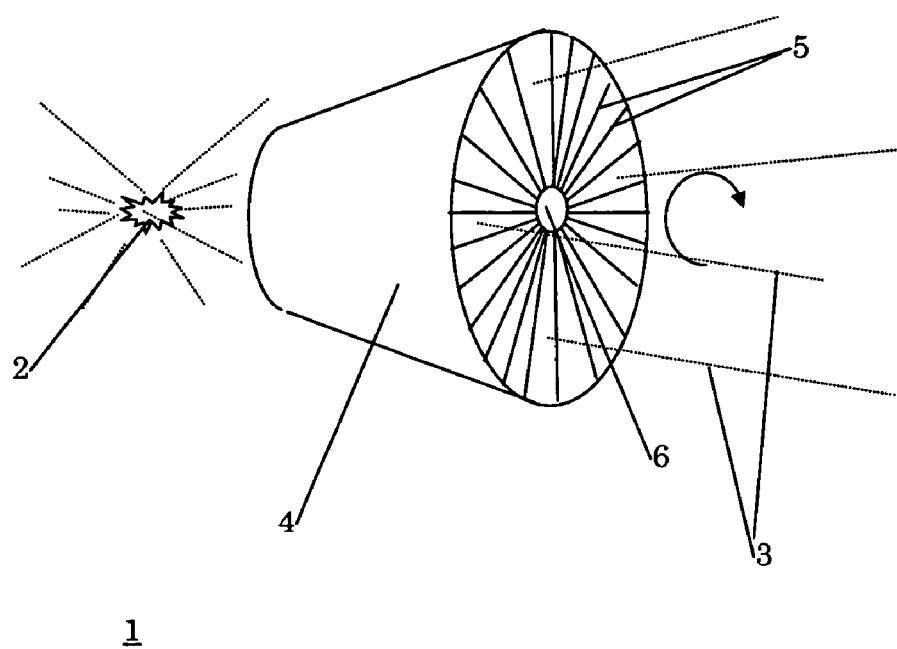
FIG. 2 shows a general setup of a rotatable foil trap according to an embodiment of the invention.

FIG. 2 schematically shows a radiation system 1 configured to provide a projection beam of radiation. The radiation system 1 comprises an extreme ultraviolet radiation source 2 configured to provide extreme ultraviolet radiation. In the Figure, the dashed lines represent EUV radiation 3 coming from an EUV source 2, typically a laser induced plasma source or a plasma discharge source such as a tin, lithium or xenon source, however, other sources are possible, in particular, any other source that produces EUV radiation in combination with fast particles that escape from the source 2 and that should be trapped in order to prevent damage to the downstream optics of the lithographic apparatus (not shown). Further, a rotatable contamination barrier 4 is provided comprising a plurality of closely packed blades 5 configured to trap contaminant material coming from the radiation source 2. The blades 5 are radially oriented relative to a central rotation axis 6 of the contamination barrier 4. Another name for the barrier is a (rotatable) foil trap. By rotation of the blades 5, fast moving particles, in particular, tin particles and gaseous and ion like particles traveling away from the source 2 can be trapped while EUV radiation, due to the speed of light, can travel generally unhindered by the blades 5.

The foil trap 4 thus functions as a contamination barrier to trap contaminant material coming from the radiation source 2. Typically, the blades 5 are arranged at a distance of 0.3-5 mm apart and have a generally rectangular form. Advantageously, the source 2 is positioned at an intersection of extended planes through the plurality of blades 5 which define an optical center of the contamination barrier 1, which in FIG. 2 coincides with the central axis 6 of the foil trap 4. For an ideal point like EUV source 2 at this center, radiation would pass in a direction generally parallel to an orientation of the blades 5. Thus, shielding of EUV radiation is low and only takes place over a thickness of the blade (which, in an embodiment, is accordingly kept small without compromising mechanical integrity). A typical value of the thickness of the blade can be about 100 microns, which may result in a shielding of about 10 percent of the radiation.

To improve structural integrity, according to an embodiment of the invention, the blades 5 comprise a metal compound having crystals oriented generally radially relative to the central rotation axis 6. In this aspect, the term "compound" is deem to encompass all type of combinations of metals, in pure form or in alloy form, in combination with any other substance, in particular, oxides and/or carbides thereof. Furthermore, the term "crystal" is used to indicate the crystalline zones in metal, which have typical dimensions of several tens to hundreds of micrometers and which provide an orientation to the metal compound, in particular, a configurable orientation, for instance, by forging the metal compound to orient the crystal zones in a single general direction. An example of such crystalline zones will be discussed below with reference to FIG. 6. Due to the high rotation speed, in particular, with a high process temperature of the contamination barrier of well above 600° C., considerable stress may arise in the blades 5. For example, for a plasma source 2, an estimated particle speed may be about 600-1000 m/s. Typical dimensions of the blades 5 are 40-50 mm long in the radial direction, and 15-25 mm long in the axial direction. A typical thickness of a blade is 80-120 micrometers. For such dimensions, the blades 5, when rotated at speeds of 15000-30000 RPM, may experience a tensile force of about 100-200 $N/mm^2$.

Figure 3:
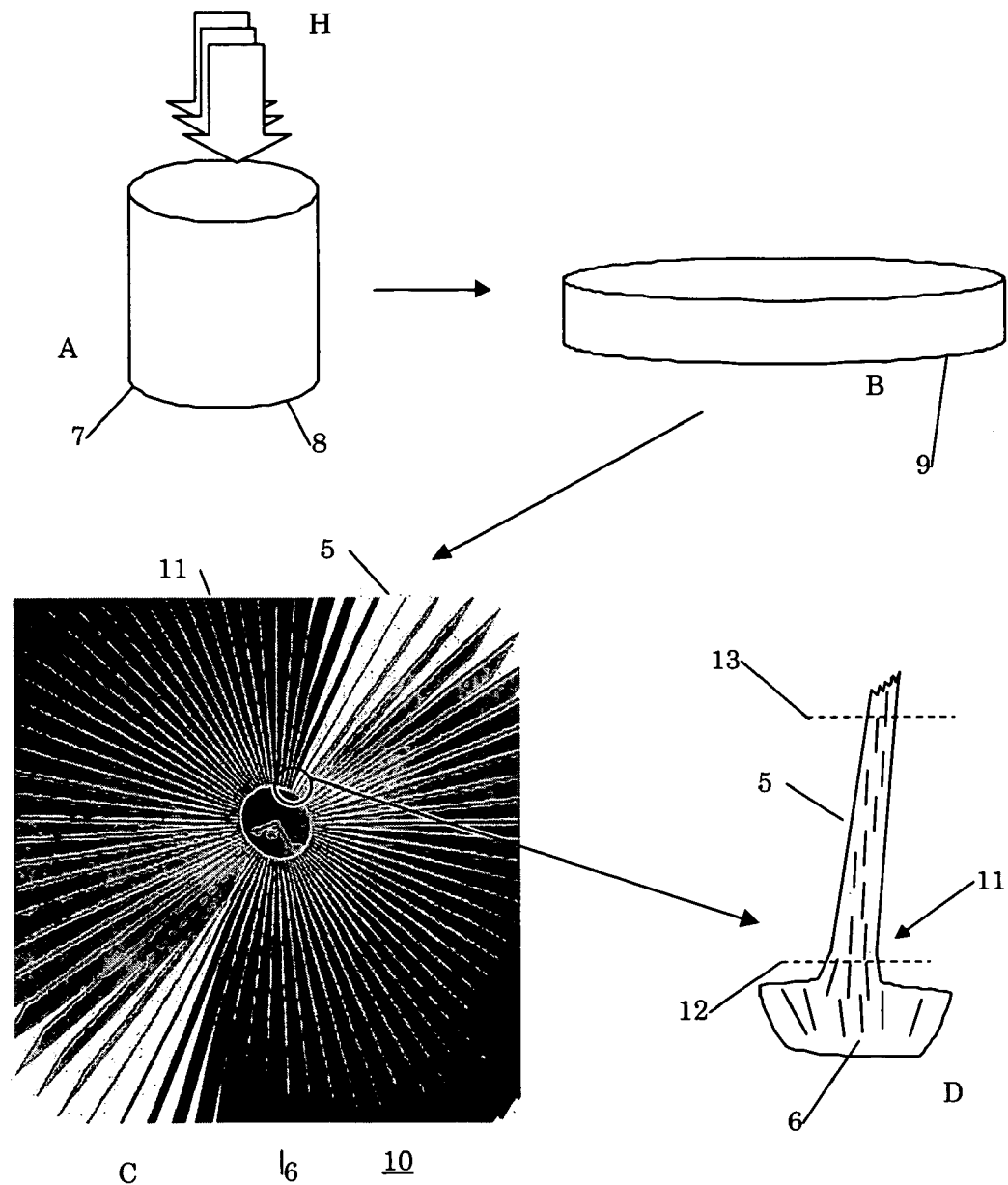
FIG. 3 shows schematically the steps for manufacturing a monolithic foil trap according to an embodiment of the invention.

FIG. 3 schematically shows an embodiment of the invention, wherein the crystalline zones of the metal compound are provided oriented radially relative to the rotation axis 6 of the contamination barrier 4. In this embodiment, a monolithic contamination barrier, in particular, a blade structure 10 is shown, which obviates the need for providing welds or bonds between the blades 5 and the rotation axis 6. The monolithic rotatable contamination barrier is formed from a rod-shaped metal compound 7 having crystals with a configurable orientation. In particular, a compound 7 may be used which is a molybdenum alloy containing molybdenum, 1-1.4 weight percentage hafnium, and 0.05-0.15 weight percentage carbon, commercially obtainable as MHC® from, for instance, Plansee SE. The term rod-shaped does not imply a specific form, in particular, the cross-section may be any form such as square, circular, etc. It merely implies that the metal compound 7 has a sufficient axial dimension so that it can be compressed while leaving a substantial thickness equal to a desired axial length of the contamination barrier. Through axial compressing of the rod, schematically illustrated in FIG. 3A, the rod will start to expand in an expansion zone, which typically would be the end side 8 of the rod 7. This compressing step can be carried out by forging, in particular, hammering (schematically illustrated by arrows H) the compound at a sufficiently high temperature (typically 800-1000° C.) so that the compound is axially shortened. Consequently, the crystals in the expansion zone 8 will become radially aligned. The object 9 thus obtained is a flattened piece, illustrated in FIG. 3B, with a thickness generally corresponding to the axial length of the contamination barrier 1 and with a diameter generally corresponding to a diameter of the blade configuration of the barrier 1.

Next, a blade structure 10 can be cut out in the expansion zone 8 around a central zone as is illustrated in FIG. 3C. The central zone thus forms the rotation axis 6 of the contamination barrier 1. Typical cutting processes feasible for cutting the blade structure 10 are arcing and/or electro-chemical machining. In the arcing process, typically, a wire is held axially aligned to the object 9 and the blade structure 10 is cut out following a radial pattern of projected blades with an arcing wire. FIG. 3D schematically shows a detail of blade structure 10 shown in FIG. 3C, in particular, the passage zone 11 forming a connection between (part of) the central axis 6 and a single blade 5. In the passage area 11, the orientation of the crystals is, due to the radial expansion process, oriented radially, providing strength in the passage zone 11. The blade connection may be made further stronger by providing an increased thickness 12 to the passage zone 11 relative to a thickness 13 of the blade higher up along a radial direction. This enforces the connection and at the same time reduces the tensile force exerted on the connection by diminishing the mass of the blade 5.

Figure 4:
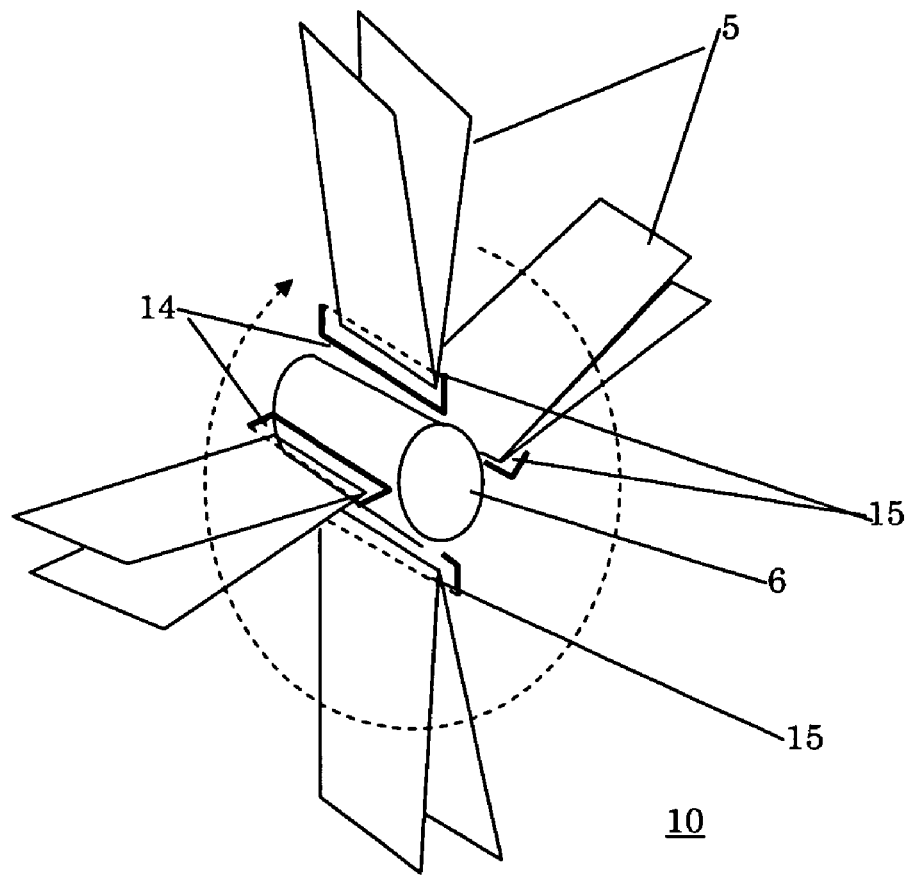
FIG. 4 shows schematically an embodiment of the invention having folded blades.

FIG. 4 shows a further embodiment of the invention showing crystals oriented along a radial direction, in particular, aligned along a force direction of centripetal forces exerted on the blades 5. In the shown embodiment, a blade structure 10 is provided having blades 5 that are mounted as folded leafs. In addition, mounting elements 14 are provided to engage the folds 15 of the folded leafs. The mounting elements 14 hold the folds 15 substantially parallel to the central axis 6 of the contamination barrier 1. The mounting elements may be wire elements or the like which are provided on a cylindrical wall of the central axis 6 as shown. Alternatively, the wire elements 14 may be provided buried in a groove axially provided in a cylindrical wall of the central axis 6. The structure shown in FIG. 4 may be provided by a rolled sheet of metal compound having a uniform crystal orientation oriented along a rolling direction. The metal compound may be a molybdenum compound as previously discussed, or, other type of compound(s) to be discussed. From the rolled sheet, a blade shape can be provided having a fold oriented transverse to the rolling direction. Next, the folds 15 can be engaged to the central axis 6 by mounting elements 14 to hold the folds 15 substantially parallel to the central axis 6 of the contamination barrier 1. Depending on the stiffness of the blades, a further structure, for example, an outer ring, or a coating or the like may be provided to orient the blades 5 radially relative to the central axis 6.

Figure 5:
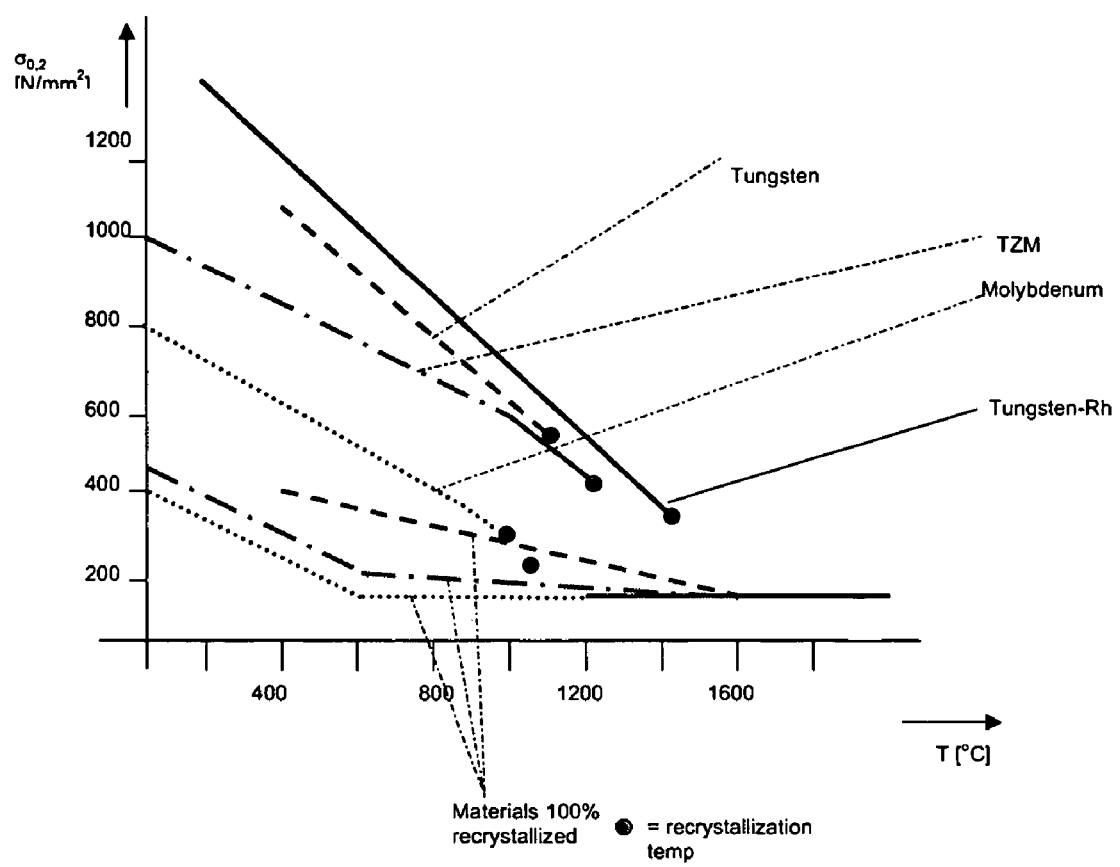
FIG. 5 shows a graph showing creep strengths of various metal compounds.

FIG. 5 further shows an analysis of creep strengths of a selection of various metal compounds. To provide sufficient creep strength, which means a tensile force of well over 200 N/mm$^2$ (about 250-350 N/mm$^2$), a limiting factor may be the recrystallization temperature, which is a temperature near the melting temperature where the structural integrity of the metal compound starts to disintegrate due to disintegration of the crystal zones referenced as crystals previously. In the graph, the specific temperature shown is the temperature, wherein recrystallization becomes complete (100%), within one hour. It is therefore appropriate to select a material that has a recrystallization temperature well above the process temperature, which can typically range from 700-900° C.

Referring to the graph, pure (that is, having a weight percentage of more than 99.95% Mo) molybdenum having a recrystallization temperature of about 1000° C. appears less appropriate for use as a foil trap material. On the other hand, a TZM alloy, which is a molybdenum alloy containing molybdenum, 0.3-0.7 weight percentage titanium, 0.06-0.1 weight percentage zirconium and 0.005-0.06 weight percentage carbon has a recrystallization temperature of 1200° C. which is considerably higher. Other materials having higher recrystallization temperatures are tungsten (about 1100° C.) and tungsten rhenium (about 1400° C.).

Figure 6:
FIG. 6 shows a micrograph of a cross sectional view of a material for use in the foil trap according to an embodiment of the invention.

FIG. 6 shows a micrograph of a cross-sectional view of oriented crystals 16 of a material for use in the foil trap according to an embodiment of the invention. The particular material is MLR, which is a molybdenum alloy comprising one or more lantanum oxides that are provided by 0.1-1 weight percentage $La_2O_3$. MLR (Molybdenum Lantanum Recrystallized) is commercially obtainable from Plansee SE. Other materials of interest are so called oxygen dispersed strengthened (ODS) alloys or superalloys, which preserve a high structural integrity, even when approaching a melting temperature. The ODS materials, such as the above mentioned MLR, comprise one or more oxides provided on the boundaries of the crystals amounting to increased structural strength. Other types of such materials which can be used to provide a metal compound material having crystals with configurable orientation are ML (Molybdenum Lantanum) and MLS (Molybdenum Lantanum Stress Free annealed) also obtainable from Plansee SE.

Another type of material having high structural (creep) strength of above 200 N/mm$^2$ is the superalloy Haynes 282™, which is a wrought gamma-prime strengthened alloy and contains 56-60 weight percentage nickel, 17-21 weight percentage chromium, 8-12 weight percentage cobalt, 8-9 weight percentage molybdenum, 1-2 weight percentage aluminum and 1.5-2.5 weight percentage titanium. In particular, this material shows creep strength values for 1 percentage creep in 1000 hours, of 33 N/mm$^2$ for a temperature of 927° C.; 68 N/mm$^2$ for a temperature of 871° C.; 145 N/mm$^2$ for a temperature of 816° C. and 241 N/mm$^2$ for a temperature of 760° C. It may therefore provide reliable structural integrity having a creep strength of more than 100 MPa for a production of 1 percent creep in 1000 hours, at a working temperature of 800° C.

Generally, metal compounds of interest to carry out one or more embodiments of the invention are alloys comprising at least one selected out the group of tantalum, hafnium, titanium, zirconium, molybdenum, lantanum, cobalt, iron, nickel, chromium, aluminum, oxides thereof, and/or carbides thereof.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A rotatable contamination barrier for use in an EUV system, the barrier comprising a plurality of closely packed blades configured to trap contaminant material coming from an EUV radiation source, the blades radially oriented relative to a central rotation axis of the contamination barrier, wherein the blades comprise a metal compound having a uniform crystal orientation oriented generally radially relative to the central rotation axis.

2. The barrier of claim 1, wherein the metal compound has a creep strength of more than 100 MPa for a production of 1 percent creep in 1000 hours, at a temperature of 800° C.

3. The barrier of claim 1, wherein the metal compound is a molybdenum metal compound or an alloy thereof.

4. The barrier of claim 3, wherein the molybdenum alloy comprises hafnium, zirconium, lantanum, cobalt, or any combination thereof.

5. The barrier of claim 4, wherein the molybdenum alloy contains molybdenum, 0.3-0.7 weight percentage titanium, 0.06-0.1 weight percentage zirconium and 0.005-0.06 weight percentage carbon.

6. The barrier of claim 4, wherein the molybdenum alloy contains molybdenum, 1-1.4 weight percentage hafnium, and 0.05-0.15 weight percentage carbon.

7. The barrier of claim 4, wherein the molybdenum alloy comprises an oxygen dispersed strengthened (ODS) reinforcement material.

8. The barrier of claim 7, wherein the ODS material comprises a lantanum oxide.

9. The barrier of claim 7, wherein the lantanum oxide is provided by 0.1-1 weight percentage $La_2O_3$, commercially obtainable as Molybdenum Lantanum Recrystallized MLR® or Molybdenum Lantanum Stress Free annealed MLS®.

10. The barrier of claim 1, wherein the metal compound comprises a nickel, chromium, cobalt, molybdenum, aluminum, and titanium alloy.

11. The barrier of claim 10, wherein the alloy is a wrought gamma-prime strengthened alloy and contains 56-60 weight percentage nickel, 17-21 weight percentage chromium, 8-12 weight percentage cobalt, 8-9 weight percentage molybdenum, 1-2 weight percentage aluminum and 1.5-2.5 weight percentage titanium.

12. The barrier of claim 1, wherein the metal compound comprises at least one selected out of the group of tantalum, hafnium, titanium, zirconium, molybdenum, lantanum, cobalt, iron, nickel, chromium, aluminum, tungsten, an oxide thereof and a carbide thereof.

13. The barrier of claim 1, wherein the blades are mounted as folded leafs, and wherein the contamination barrier comprises mounting elements engaging the folds to hold the folds parallel to the central rotation axis of the contamination barrier.

14. The barrier of claim 1, wherein the blades are provided monolithically with the central rotation axis.

15. The barrier of claim 1, wherein the blades are provided with a decreasing thickness along a radial direction.

16. A lithographic apparatus, comprising:
a rotatable contamination barrier comprising a plurality of closely packed blades configured to trap contaminant material coming from a radiation source, the blades radially oriented relative to a central rotation axis of the contamination barrier, wherein the blades comprise a metal compound material having a uniform crystal orientation oriented generally radially relative to the central rotation axis;
an illumination system configured to condition a beam of radiation;
a support constructed to support a patterning device, the patterning device being capable of imparting the radiation beam with a pattern in its cross-section to form a patterned radiation beam;
a substrate table constructed to hold a substrate;

a projection system configured to project the patterned radiation beam onto a target portion of the substrate.

17. The barrier of claim 16, wherein the metal compound has a creep strength of more than 100 MPa for a production of 1 percent creep in 1000 hours, at a temperature of 800° C.

18. The barrier of claim 16, wherein the metal compound is a molybdenum metal compound or an alloy thereof.

19. The barrier of claim 18, wherein the molybdenum alloy comprises hafnium, zirconium, lantanum, cobalt, or any combination thereof.

20. The barrier of claim 16, wherein the metal compound comprises a nickel, chromium, cobalt, molybdenum, aluminum, and titanium alloy.

21. The barrier of claim 20, wherein the alloy is a wrought gamma-prime strengthened alloy and contains 56-60 weight percentage nickel, 17-21 weight percentage chromium, 8-12 weight percentage cobalt, 8-9 weight percentage molybdenum, 1-2 weight percentage aluminum and 1.5-2.5 weight percentage titanium.

22. The barrier of claim 16, wherein the metal compound comprises at least one selected out of the group of tantalum, hafnium, titanium, zirconium, molybdenum, lantanum, cobalt, iron, nickel, chromium, aluminum, tungsten, an oxide thereof and a carbide thereof.

23. The barrier of claim 16, wherein the blades are mounted as folded leafs, and wherein the contamination barrier comprises mounting elements engaging the folds to hold the folds parallel to the central rotation axis of the contamination barrier.

24. The barrier of claim 16, wherein the blades are provided monolithically with the central rotation axis.

25. The barrier of claim 16, wherein the blades are provided with a decreasing thickness along a radial direction.

26. An extreme ultraviolet (EUV) radiation system, comprising:
 a source of EUV radiation; and
 a rotatable contamination barrier comprising a plurality of blades configured to trap contaminant material coming from the source, the blades radially oriented relative to a central rotation axis of the contamination barrier, wherein the blades comprise a metal compound having a uniform crystal orientation oriented generally radially relative to the central rotation axis.

* * * * *

UNITED STATES PATENT AND TRADEMARK OFFICE
CERTIFICATE OF CORRECTION

PATENT NO. : 7,453,071 B2 Page 1 of 1
APPLICATION NO. : 11/391691
DATED : November 18, 2008
INVENTOR(S) : Arnoud Cornelis Wassink It is certified that error appears in the above-identified patent and that said Letters Patent is hereby corrected as shown below:

On the title page, item (56), References Cited under OTHER PUBLICATIONS, please add --PCT International Search Report and Written Opinion issued for PCT Application No. PCT/NL2007/050108, dated August 10, 2007--.

Signed and Sealed this

Eighteenth Day of August, 2009

David J. Kappos
*Director of the United States Patent and Trademark Office*